United States Patent [19]

Kohno

[11] Patent Number: 4,923,823
[45] Date of Patent: May 8, 1990

[54] METHOD OF FABRICATING A SELF ALIGNED SEMICONDUCTOR DEVICE

[75] Inventor: Yasutaka Kohno, Itami, Japan

[73] Assignee: Mitsubishi Denki Kabushiki Kaisha, Tokyo, Japan

[21] Appl. No.: 248,429

[22] Filed: Sep. 23, 1988

[30] Foreign Application Priority Data

Sep. 30, 1987 [JP] Japan .................. 62-246547

[51] Int. Cl.$^5$ ............................................. H01L 21/28
[52] U.S. Cl. ...................... 437/41; 437/39; 437/189; 437/200; 437/912; 437/177
[58] Field of Search ............ 437/39, 189, 192, 41, 437/200, 196, 912, 190, 175, 176, 177; 357/15; 148/DIG. 147, DIG. 139, DIG. 140

[56] References Cited

U.S. PATENT DOCUMENTS

| | | | |
|---|---|---|---|
| 4,285,761 | 8/1981 | Fatula Jr. et al. | 437/200 |
| 4,322,453 | 3/1982 | Miller | 437/200 |
| 4,574,298 | 3/1986 | Yamagishi et al. | 357/15 |
| 4,700,455 | 10/1087 | Shimada et al. | 437/41 |

FOREIGN PATENT DOCUMENTS

| | | | |
|---|---|---|---|
| 0086724 | 5/1983 | Japan | 437/190 |
| 0090727 | 5/1983 | Japan | 437/192 |
| 0039865 | 3/1985 | Japan | 357/15 |
| 0132375 | 7/1985 | Japan | 357/15 |
| 0214481 | 9/1986 | Japan | 357/15 |
| 0290775 | 12/1986 | Japan | 357/15 |
| 0052962 | 3/1987 | Japan | 357/15 |

*Primary Examiner*—Brian E. Hearn
*Assistant Examiner*—Tuan Nguyen
*Attorney, Agent, or Firm*—Leydig, Voit & Mayer

[57] ABSTRACT

A method of producing a semiconductor device, such as a MESFET having a self-aligned gate. A triple layer film is formed on the semiconductor substrate. The lowermost layer is a high melting point metal silicide, the intermediate layer a thin high melting point metal and the upper layer an insulator. The thicknesses and etching rates of the layers are selected such that the thin intermediate metal layer protects the underlying silicide and overlying insulator layers during etching. The three layers are anisotropically etched to produce a well-formed gate structure which is used as a mask in an ion implantation step for forming source and drain regions. A subsequent selective etching process removes the insulator layer (which serves as a dummy gate) exposing the underlying silicide layer on which is deposited a low resistance metal such as gold in a self-aligned fashion thereby to improve the high frequency performance of the device.

16 Claims, 9 Drawing Sheets

METHOD OF FABRICATING A SELF ALIGNED SEMICONDUCTOR DEVICE

FIELD OF THE INVENTION

This invention relates to semiconductor devices, and more particularly to semiconductor devices such as MESFET's which require metallic gate structures having both high temperature and low resistance properties precisely positioned on a semiconductor substrate.

BACKGROUND OF THE INVENTION

A very important device of the type characterized generally above is the self-aligned gate MESFET. Self-aligned gate technology is adapted to enhance high frequency performance by using the gate as a mask to create the FET source and drain, thereby to get almost perfect alignment between those elements. In addition, as such circuits become miniaturized for purposes such as MMIC's (monolithic microwave integrated circuits), it is important to increase circuit density which requires precise alignment between multiple layers as they are deposited one upon the other during the semiconductor fabrication process.

The prior art has employed high melting point metallic gates, such as metal silicides, for example tungsten silicide, because the high melting point property of those gates can withstand the relatively high annealing temperatures applied during formation of the source and drain regions after deposition of the gate. One prior art technique using a metal silicide gate is described in connection with FIGS. 3(a)-3(d). Those figures show cross-sectional structures illustrating the process steps of one prior art method for producing a self-aligned gate MESFET device.

FIG. 3(a) shows an early stage of device production in which an active layer 10 is produced in a semi-insulative GaAs substrate 1 by ion implantation. A high melting point metal silicide layer 2, such as tungsten silicide, is plated by evaporation or sputtering over the entire exposed surface of the active layer 10. A gate pattern is formed on the layer 2 by means of a photoresist film 5 which is exposed and processed to protect the gate region while leaving the remaining area of the layer 2 exposed to an etching process.

Advancing to FIG. 3(b), it is seen that a gate electrode is produced by reactive ion etching of the high melting point metal silicide layer 2 using the photoresist film 5 as a mask. Following the etching step, the high melting point metal silicide gate can then serve as a mask for formation of the source and drain regions in the semiconductor substrate. As is known in the art, after removing residuals by an acid wash, ion implantation into substrate 1 is carried out using the metal silicide gate as a mask to form highly doped regions 7 (FIG. 3(c)) which become source or drain regions. Having implanted impurities into the regions 7, the device is then annealed at an elevated temperature, such as 800° C. to allow the implanted atoms to move into appropriate locations in the lattice sites. Then source and drain electrodes 6 are deposited using conventional vapor plating lift-off techniques to obtain a completed MESFET device as illustrated in FIG. 3(d).

It is because of the high temperature annealing that the high temperature properties of the gate 2 are important. More particularly, it is necessary having used the gate 2 to align the source and drain, to maintain the gate in its appropriate location to retain the desired alignment, thereby to assure best high frequency performance. Although the high melting point metal silicide gate of this prior art technique is produced by the self-aligning method as described above, the resistance of the gate electrode is relatively high. As a result, the field effect transistor thus produced has a noise figure which deteriorates at high frequencies, limiting its use in high frequency applications.

It is known that one of the solutions to the high frequency noise problem is to deposit a low resistance metal on the high melting point metal silicide gate. Adopting that approach reduces the resistance in the gate circuit, and thus improves high frequency performance. While it is possible to crudely deposit a low resistance metal such as aluminum or gold over and in the general vicinity of the high melting point silicide gate, in order to maintain the benefits of miniaturization as they relate to high packing density as well as high frequency operation, attempts have been made to produce a low resistance gate on the high melting point silicide gate in a self-aligning manner.

One such technique is illustrated in FIGS. 4(a)-4(h). FIG. 4(a) illustrates the initial stages of a process in which a GaAs substrate 1 has n-type dopant material ion implanted in an active layer 10, following which a high melting point metal silicide film 2 is deposited on the substrate surface. An insulating layer 4, such as $SiO_2$, is then deposited on the high melting point metal silicide film 2 by sputtering, evaporation or CVD techniques. A photoresist film 5 is then deposited over the double layer 2, 4 to form the pattern for a gate region.

Progressing to FIG. 4(b), it is seen that reactive ion etching is used to etch the layers 2, 4 using the photoresist 5 as a mask thereby to produce a structure including high melting point metal silicide layer 2 and insulating layer 4 on the substrate 1. Films 2 and 4 may be etched simultaneously under the same conditions, or a separate etching process may be carried out for each of the two films. The nature of the etchant gas, the power supplied and the processing time are process conditions that determine the etching conditions for the respective layers. Following reactive ion etching, acid is used to remove residual materials, including the photoresist film 5 or residuals producted by plasma polymerization.

As in the prior embodiment, after forming the gate structure, the gate is used as a mask for a subsequent ion implantation and annealing operations which form highly doped regions 7 to serve as the source and drain (see FIG. 4(c)). The high temperature characteristics of the regions 2, 4 are important in surviving the annealing operation to provide a self-aligned gate.

Following ion implantation and annealing, which typically takes place at about 800° C., source and drain electrodes 6 (FIG. 4(d)) are formed by evaporation and lift-off. Thereafter, as shown in FIG. 4(e), a photoresist film 8 is deposited over the entire surface of the partially completed semiconductor, and the exposed surface of the photoresist is smoothed such as by heating at about 200° C. The etched regions 2, 4 are surrounded by the resist 8; the silicide layer 2 will become part of the gate structure, while the insulating layer 4 will serve as a dummy gate, ultimately to be removed and replaced by a low resistance metal layer of the final gate structure.

As shown in FIG. 4(f), the photoresist then partly removed, as by reactive ion etching using oxygen as the gas etchant, until the upper surface of the insulating film 4 is exposed. In that condition, the device is then prepared for removal of the dummy gate 4 which is removed by wet etching which selectively attacks the silicon dioxide of the dummy gate, but will not substantially etch either the high melting point metal silicide layer 3 or the resist 8. At the conclusion of the wet etching step, the partially completed device takes the form illustrated in FIG. 4(g). Thereupon, a low resistance metal 9, preferably gold but alternatively aluminum, is deposited on the high melting point metal silicide film 2 (as well as on the photoresist 8) by evaporation, following which a lift-off process removes the photoresist with attached film leaving a self-aligned gold layer 9 deposited on the high melting point metal silicide gate 2.

In the MESFET thus produced, a low resistance metal layer such as gold or aluminum is self-aligned on the high melting point metal silicide gate, thereby to reduce the resistance of the gate electrode and increase the noise performance of the high efficiency field effect transistor, even at high frequencies.

However, the prior art production methods described above have certain deficiencies. Considering first the process illustrated in FIGS. 3(a)-3(d), it is found that deposition of the photoresist film 5 directly over the high melting point metal silicide layer 2 creates an uneven etching of the silicide layer. It is well known that high melting point metal silicides such as tungsten silicide are rather difficult to etch, and it is therefore found that depositing the resist directly over such difficult-to-etch layer will leave a constricted cross section as illustrated in FIG. 5(a). More particularly, the etching rate of the silicide layer 2 at a position close to the photoresist film 5 is slow, and the more rapid rate at lower levels where the photoresist film does not retard the etching process produces the constricted cross section shown in FIG. 5(a), making it difficult to achieve a highly precise fine pattern for the gate. When subsequent insulating films and metalized interconnections (which are formed in later process steps) are applied over such a poorly produced gate, cracks have a tendency to occur in the insulating film, potentially rendering the device defective. In greater detail, after the FET is formed, subsequent process steps (not shown in the figures) include the wiring or connecting of the formed microelectronic elements. An insulating film is first deposited over the surface of the semiconductor device, and a metal layer is then deposited over the insulator to form a wiring pattern. Excess metal is then removed using a patterning mask. The problem is illustrated in FIG. 5(b) which shows an insulating film 11(a) deposited on the constricted high melting point metal silicide film 2. It is seen that a crack C can occur in the insulating film 11(a) from the edge of the high melting point metal silicide film 2; when voltage is applied, crack C may cause the insulating film 11(a) to rupture.

With respect to the problems occasioned by utilization of the process illustrated in FIGS. 4(a)-4(h), other forms of abnormally etched elements can occur. More particularly, when the double film layer 2, 4 illustrated in FIG. 6(a) is processed by reactive ion etching, an abnormally etched portion A can occur at the interface of the high melting point metal silicide 2 and the insulating film 4 (see 6(b)). This abnormal etching appears to be caused by non-uniform stress distribution of the film, or by non-uniformity of the plasma due to an increase in oxygen concentration at the interface surface which results from the oxygen component of the silicon dioxide.

The problem is exacerbated when an acid wash is later used to remove residual products of the dry etching. The acid used for removing residuals can also etch certain of the deposited materials; the etching speed of the insulating film 4 at a portion close to the interface surface is high, and therefore, a further abnormality in the form of constricted portion B is formed as illustrated in FIG. 6(c). In later processing steps, when the photoresist film 8 is formed over the entire surface of the partially completed semiconductor, the photoresist fills the constricted portion B. When the dummy gate formed of the insulating film 4 is removed, and a low resistance metal layer 9 of gold or aluminum is deposited in its place, both side portions of the low resistance metal layer will be warped as shown in FIG. 4(h). When the circuit is further processed to include insulating films and metallized connecting layers (see FIG. 7(a)), the portions of the insulating film 11(b) which are located above the sharp edges of the low resistance metal layer 9 can be broken as shown at D in FIG. 7(b). This can cause short circuiting between the upper wiring layer 12 and the low resistance metal layer 9, thereby rendering the device defective.

SUMMARY OF THE INVENTION

In view of the foregoing, it is a general aim of the present invention to produce a semiconductor device with a precisely aligned metallic gate structure on the surface thereof, the gate structure having both high temperature and low resistance characteristics and being formed in a more reliable manner than the prior art discussed above.

In that regard, it is an object of the present invention to provide an improved method of producing a MESFET which has a self-aligned high temperature gate, a self-aligned low resistance electrode on the gate, is therefore applicable to high frequency applications, and which can be produced with greater reliability than such devices produced in the past.

In a more detailed aspect, it is an object of the present invention to produce such a MESFET device while using improved etching processes to avoid the problems which heretofore have resulted from abnormally etched layers.

In accomplishing those objects, the present invention employs a method of producing a self-aligned gate MESFET by initially successively depositing a high melting point metallic film, a thin high melting point metal film, and a heat resistant insulating film on a semiconductor substrate. That triple layer is anisotropically etched to form a gate structure having a metallic gate, an insulating dummy gate, and a thin metal separator disposed therebetween. The thin metal layer etches more slowly than either the metallic gate or the insulator, and thus protects those layers from potential etching defects resulting from uneven etching. Source and drain regions are then formed using the gate structure as a mask, the forming step including a high temperature annealing operation to which the gate structure is resistant. Diffusion during the annealing process changes the thin metal layer to a metallic layer. A resist layer is then deposited to cover the partly completed semiconductor device except for an exposed upper surface of the dummy gate. The dummy gate is then removed by a selective etching process which etches the insulator but is substantially ineffective to etch the underlying metallic gate. A low resistance metal layer is then plated on the exposed metallic layer to form a low resistance self-aligned electrode on the high melting point gate.

Other objects and advantages will become apparent from the following detailed description when taken in conjunction with the drawings, in which:

DETAILED DESCRIPTION OF THE PREFERRED EMBODIMENTS

Figure 1A:
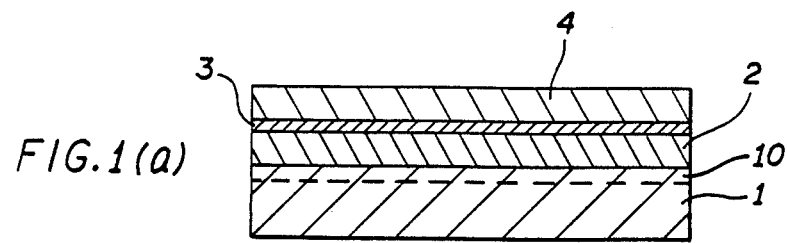
FIGS. 1(a)–1(h)) are diagrams showing cross-sectional views in the major process steps of a method for producing a MES-type field effect transistor as an embodiment of the present invention.

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Turning now to the drawings, FIGS. 1(a)–1(h) illustrate the major steps in producing a MESFET according to the present invention. An active layer 10 is produced in a semi-insulative GaAs substrate 1 by ion implantation of dopant elements, such as silicon or selenium. Ion implantation damages the crystal lattice and the implanted atoms come to rest at random locations within the material. A high temperature annealing step at about 800° C. is then performed to remove the lattice damage and to allow the implanted atoms to move into lattice sites.

Having thus prepared the semiconductor substrate, materials are then applied to the substrate for forming the gate structure. A high melting point metal silicide, )i.e., metallic) film 2, a thin high melting point metal film 3, and an insulating film 4 are successively deposited on the semiconductor substrate 1 using evaporation, sputtering, or CVD methods. The metallic film 2 forms a Schottky barrier with the semiconductor substrate and will therefore serve as a high melting point metal silicide gate. The metal layer 3 has an etching speed which is slower than either the silicide or insulator layers and is interposed to protect those layers. The insulator layer 4 will serve as a dummy gate. In the preferred practice of the present invention, tungsten silicide is used as the high melting point metal silicide film and the layer is about 3000 to 5000Å in thickness. Tungsten is preferred as the intermediate metal film; the metal layer is maintained very thin—on the order of 100Å—thick enough to protect the underlying silicide from the more rapid etching of the overlying insulator, but thin enough that it etches almost as quickly as the underlying silicide so as not to substantially retard silicide etching at the interface with the metal. The preferred material for the insulator layer is silicon dioxide because it can be selectively etched; the thickness is not important but it can be on the order of 3000 to 5000Å like the silicide layer. Other high melting point materials may also be used, such as molybdenum silicide for the metallic layer, and tungsten, molybdenum, or tantalum, for the metal layer.

Figure 1B:
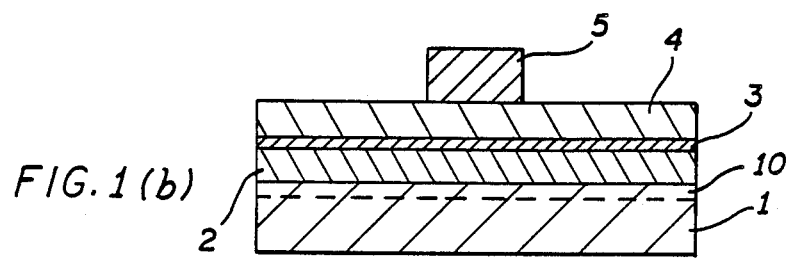
Figure 1C:
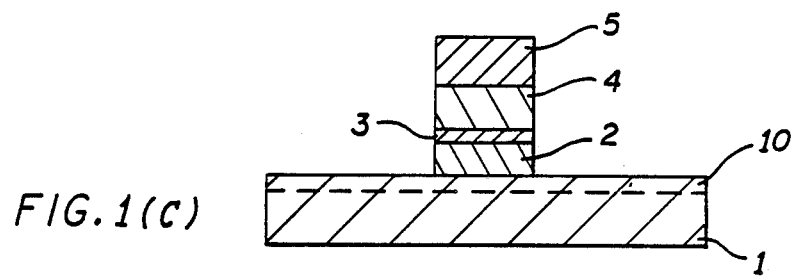

Following deposition of the triple layer as shown in FIG. 1(b), a gate pattern is formed on film 5 by way of a photoresist film 5. Reactive ion etching is then carried out using a fluorine containing etchant, preferably CF$_4$ and oxygen as an etchant, but alternatively employing SF$_6$ to remove the portions of films 2, 3, and 4 not masked by film 5 (see FIG. 1(c)). In a preferred embodiment, the gas pressure in the reactive ion etching process lies in the range between about 10 mTorr to about 100 mTorr and is preferably 25 mTorr, the power ranges from about 50 watts to about 100 watts and is preferably about 75 watts, and the gas flow rate ranges from about 5 standard cubic centimeters per minute (sccm/min) to about 50 sccm/min and is preferably about 6.3 sccm/min. The process is preferably performed at about 25° C.

As in the prior art, the reactive ion etching process which forms the self-aligned gate structure is anisotropic. However, due to the formation of the respective layers, the current process is a substantial improvement over the prior art techniques which position the high melting point metal silicide gate layer adjacent materials which will cause etching abnormalities. It is recalled in the FIG. 3 embodiment that the silicide gate layer is positioned adjacent the photoresist and thus will have an abnormally etched portion adjacent the photoresist, and in the FIG. 4 embodiment it is positioned adjacent an insulator layer such as SiO$_2$ which etches much more quickly than the silicide and thus tends to undercut the silicide.

Figure 2A:
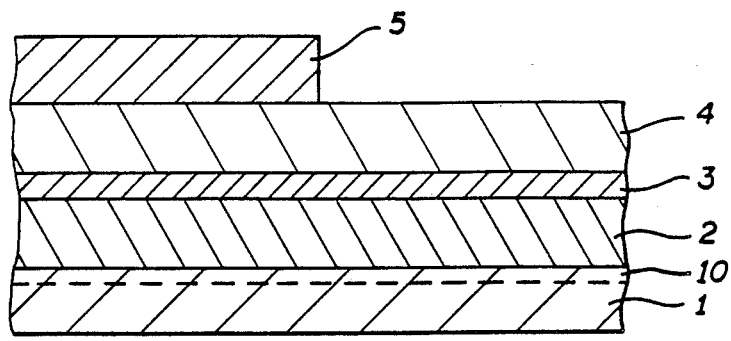
FIGS. 2(a)–2(c) are diagrams on an enlarged scale showing some of the process steps of FIGS. 1(a)–1(h)
Figure 2B:
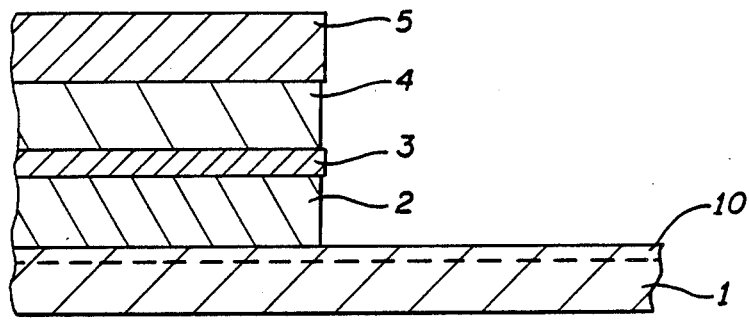
Figure 2C:
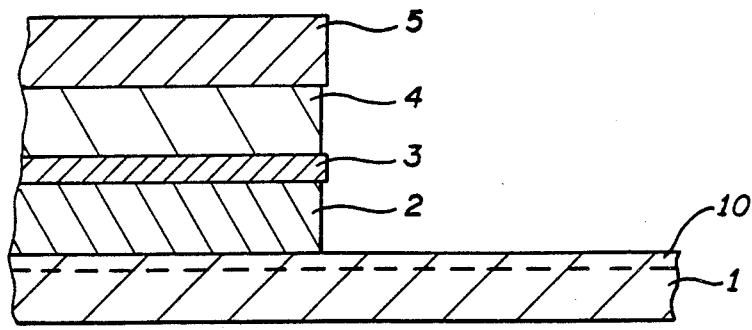
Figure 3A:
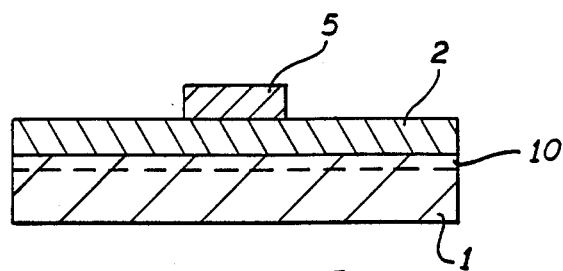
FIGS. 3(a)–3(d) show cross-sectional views of structures illustrating the process steps in a prior art method for producing a MES-type field effect transistor.
Figure 3B:
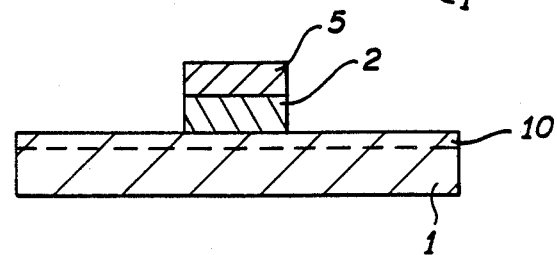
Figure 3C:
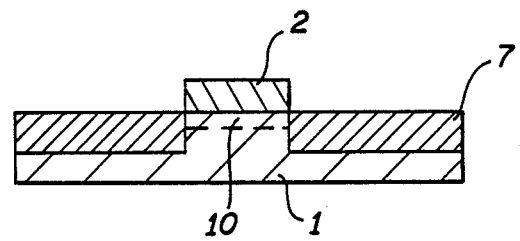
Figure 3D:
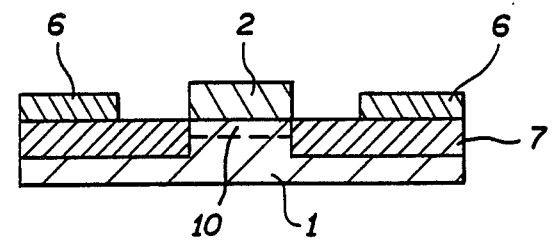
Figure 4A:
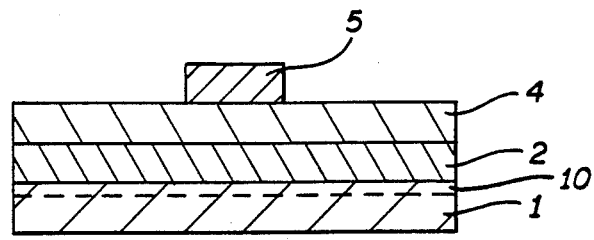
FIGS. 4(a)–4(h) are diagrams showing cross-sectional views exemplifying another prior art production method of a MES-type field effect transistor.
Figure 4B:
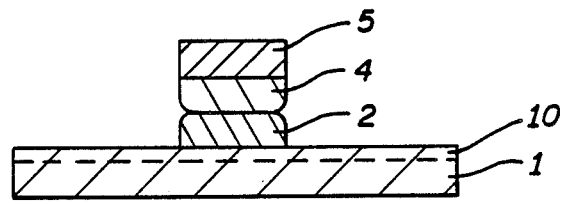
Figure 4C:
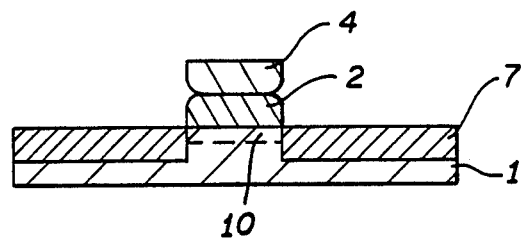
Figure 4D:
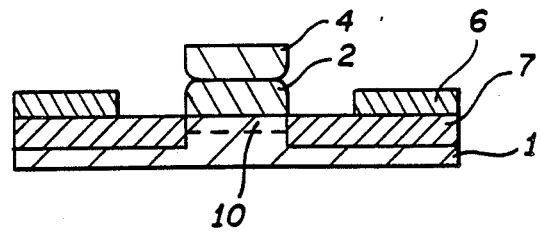
Figure 5A:
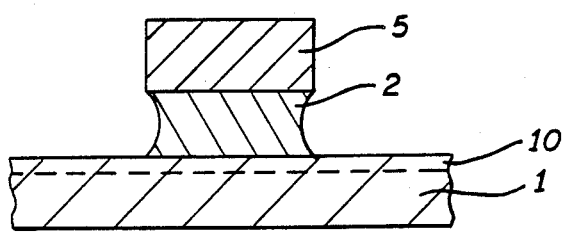
FIGS. 5(a)–5(b) are diagrams illustrating disadvantages of semiconductors produced by the prior art method of FIGS. 3(a)–3(d)
Figure 5B:
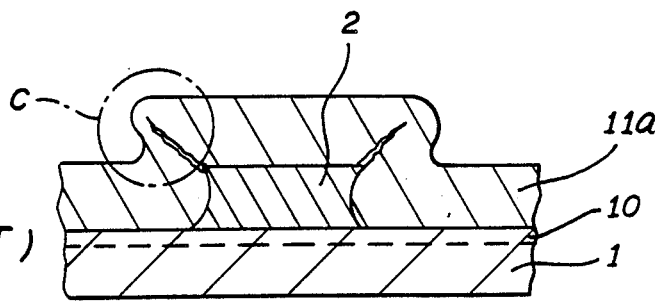
Figure 4E:
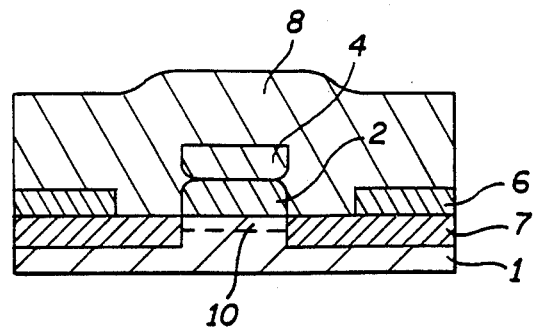
Figure 4F:
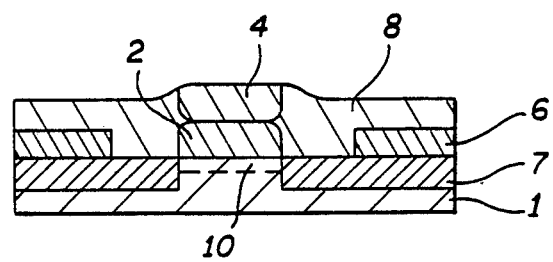
Figure 4G:
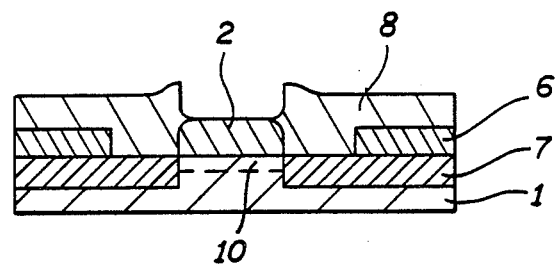
Figure 4H:
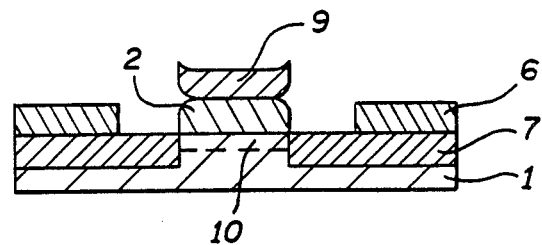
Figure 6A:
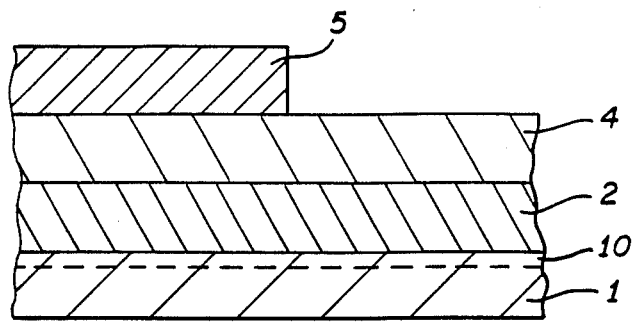
FIGS. 6(a)–6(c) and 7(a)–7(b) are diagrams illustrating disadvantages associated with semiconductors produced by the prior art method of FIGS. 4(a)–4(h).
Figure 6B:
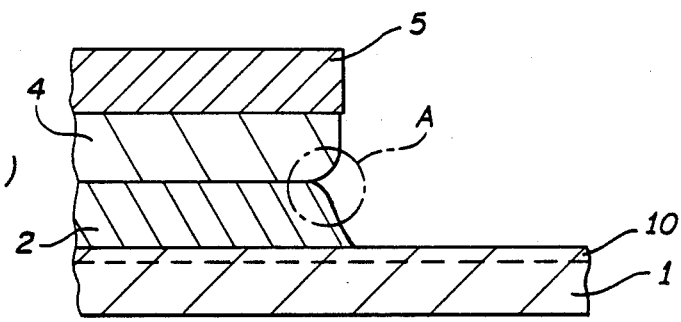
Figure 6C:
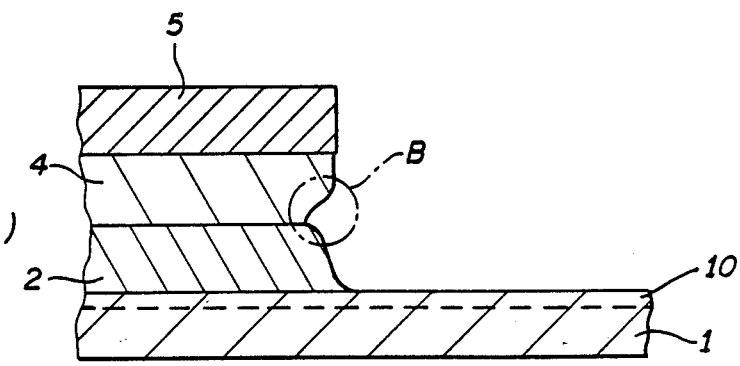
Figure 7A:
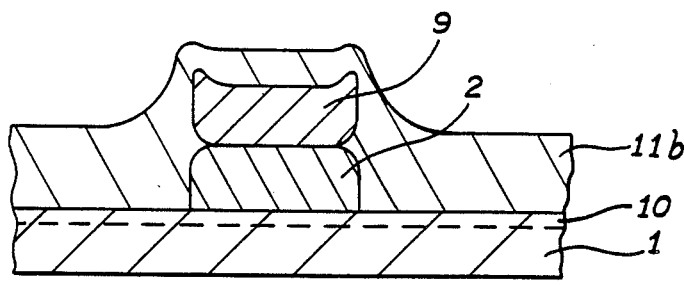
Figure 7B:
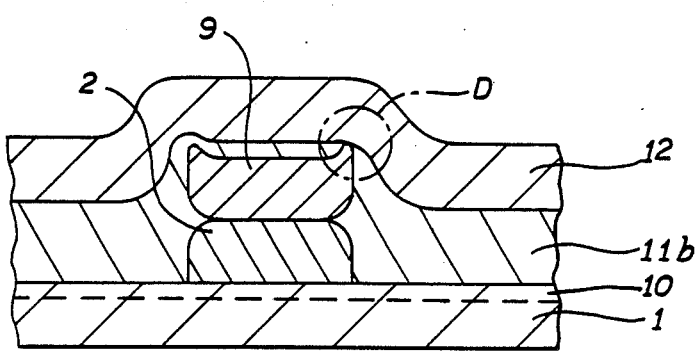

In practicing the present invention, the metal silicide layer which is to form the gate structure (i.e., the layer 2) is associated with the additional layers in such a way that the anisotropic etching step will create little or no etching defects in the gate silicide layer. Thus, in the illustrated embodiment, high melting point metal layer 3 is disposed between the gate silicide layer 2 and insulator layer 4, for protection of those layers during initial etching. The high melting point metal is more resistant to the etchant than the metal silicide or the insulator, and thus serves to protect the opposed layers from undercutting, while also being etched as part of the three level gate structure. The thickness of the metal layer 3 is maintained at about 100Å. As such, it provides adequate protection for the silicide layer 2 even in the case where the insulator layer 4 would tend to undercut. It is not overly thick, however, so as to avoid production of a constricted portion in the silicide layer (similar to the FIG. 3 embodiment). In short, the multiple layers which appear in partially enlarged view in FIG. 2(a) are anisotropically etched to produce the structure illustrated in FIG. 2(b) where the thin intermediate metal layer 3 is only slightly less etched than the surrounding silicide and insulator layers 2, 4, respectively. Even when an acid wash is used to remove residuals from the dry etching process, the silicide and insulator layers 2, 4 are not substantially undercut as illustrated in FIG. 2(c). Thus, during the anisotropic etching step and subsequent acid wash, the three layers are etched at substantially the same rate to form relatively vertical non-undercut edges as shown in FIG. 2(c), thereby avoiding the problems encountered in subsequent process steps when utilizing the prior art technique.

Having thus partially formed the gate structure, it is then possible to utilize the gate as a mask in forming the source and drain regions, thereby producing a self-aligned gate structure. More particularly, dopant material, such as silicon or selenium, is ion implanted into substrate 1 using the three-film gate structure as a mask. High dopant concentration layer 7, from which the source and drain regions are formed, are then annealed at about 800° C. The high temperature during the annealing process causes silicon in the high melting point metal silicide layer 2 to diffuse into the metal film 3, transforming the metal layer into a metal silicide. Since the metal layer is only about 100Å in thickness, substantially the entire layer will be transformed to a silicide.

Figure 1D:
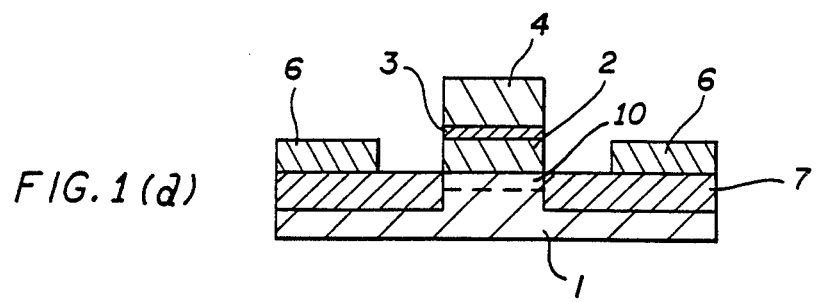
Figure 1E:
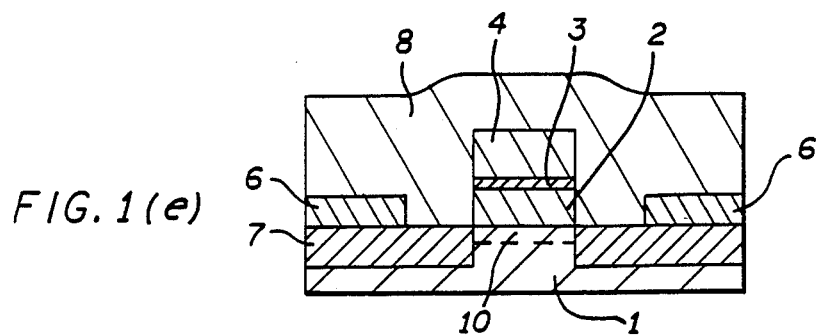
Figure 1F:
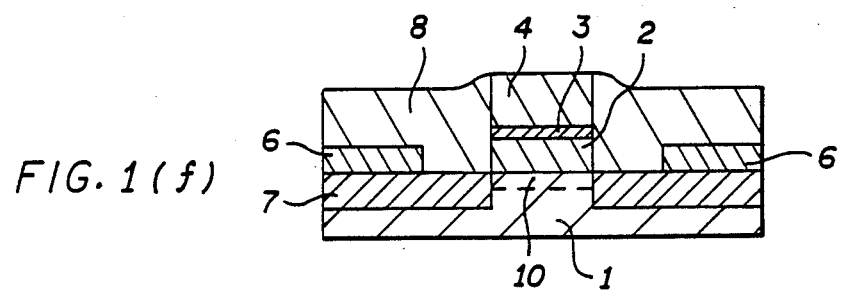

After annealing, source and drain electrodes 6 are produced by depositing and patterning a metal layer, such as Ni/Au/Ge by evaporation and lift-off techniques (see FIG. 1(d)). Thereafter, as shown in FIG. 1(e), a photoresist film 8 is deposited on the entire surface of the partially completed device. The surface of the resist is smoothed, for example by heating at about 200° C., and is formed such that the upper surface of insulator 4 is exposed while the remainder of the device is protected by photoresist, as shown in FIG. 1(f). The photoresist film 8 can be removed by reactive ion etching, using oxygen, until the upper surface of the insulator film 4 is exposed.

Figure 1G:
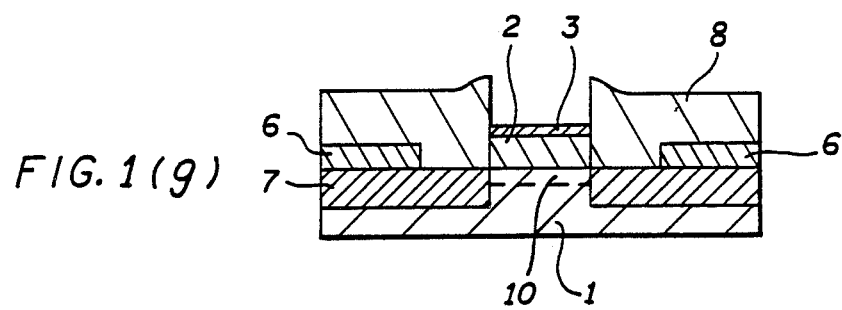
Figure 1H:
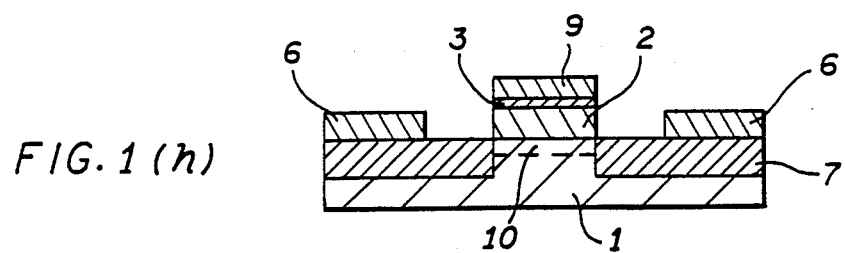

Having thus exposed the entire upper surface of the insulator layer 4, it is then possible to treat the layer 4 as a dummy gate to be removed and replaced by desirable gate material. In the preferred embodiment, the insulator film 4 is removed by a selective etching process which aggressively attacks the insulator material but is relatively ineffective to attack either the photoresist 8 or the underlying high melting point metal silicide layers 2, 3. It is for that reason that $SiO_2$ is the preferred material for the dummy gate, and wet etching is used to remove the $SiO_2$ dummy gate without substantially attacking the remainder of the partially completed semiconductor device. The condition of the partially completed semiconductor with the dummy gate removed is illustrated in FIG. 1(g).

In practicing the invention, having formed and then removed the dummy gate structure as described above, a low resistance metal is self-alignedly plated onto the gate structure in the position vacated by the dummy gate. More particularly, a film of a low resistance metal 9, such as gold or aluminum, is deposited by evaporation on the high melting point metallic film 2, 3 (as well as on the upper surface of the photoresist 8). The photoresist 8 and excess low resistance metal 9 are then removed by a lift-off method, leaving a low resistance metal film 9, such as gold, self-alignedly deposited on the high melting point metal silicide films 2, 3. As noted above, the presence of the low resistance metal in the gate structure reduces the resistance of the gate electrode, thereby improving the noise performance at high frequencies. Furthermore, as will now be apparent, the low resistance metal is deposited in such a way that a flat layer of gold without undercuts or other deformations caused by prior imperfect etching steps is provided, such that subsequent application of insulating and metalized conductor films can be accomplished without the prior art problems of the underlying structure presenting damage sites to those subsequent layers.

The low resistance metals typically used for the low resistance gate layer 9 are aluminum and gold. Gold is preferred because of its higher electrical conductivity and comparative inertness. However, at high temperatures, gold may diffuse into the high melting point metal silicide film, and ultimately adversely affect the Schottky barrier properties between the metal silicide film and the semiconductor. In a preferred practice of the invention, a barrier metal is applied between the metal silicide layers 2, 3 and the gold electrode 9. Metals such as molybdenum, platinum or titanium are preferred, with molybdenum being most preferred and deposited in a thickness of about 100Å over the silicide film 2, 3 and under the gold electrode 9. This barrier metal is deposited by evaporation and the gold is deposited immediately after the barrier metal, such as molybdenum, so that a reliable bond is formed.

In the above illustrated embodiment, a semi-insulative GaAs substrate is used, but the substrate may be made of other semiconductor materials with the same effects as described above.

As is evident from the foregoing description, according to the present invention, a low resistance metal layer made of a metal, such as gold or aluminum, is produced on and self-aligned with a high melting point metal silicide to form the gate of a field effect transistor. Thus, the resistance of the gate electrode is reduced, and a highly efficient field effect transistor having a low noise figure at high frequencies can be produced at high yield.

The intermediate high melting point metal film cooperates with the underlying silicide layer and the overlying insulator layer to avoid etching abnormalities. The layer is sufficiently thin that the silicide will etch rather uniformly, rather than leaving a thick upper portion at the interface with the metal, but is sufficiently thick to minimize undercutting of the insulator layer to result in a composite layer with very little undercutting at the interfaces. When the dummy gate is removed, therefore, a flat gold contact can be deposited over the silicide gate such that subsequent layers can be applied to the semiconductor without substantial danger of cracking or shorting which are typical of the prior art.

What is claimed is:

1. A method of producing a self-aligned gate MESFET comprising the steps of:
    successively depositing a high melting point metallic film, a thin high melting point metal film, and an insulative film on a semiconductor substrate;
    anisotropically etching the superimposed films to form a gate structure including a metallic gate formed by the metallic layer, a dummy gate formed by the insulative layer, and a metal separator formed by the intermediate metal layer, protecting the metallic and insulative layers during the anisotropic etching step by the interposed metal layer selected to have an etching rate slower than the metallic or insulative layers;
    forming source and drain regions using the gate structure as a mask, said forming step including a high temperature annealing operation, the metal layer being sufficiently thin and the annealing temperature being sufficient to transform the metal layer to a metallic layer;
    forming a resist layer on the partly completed device leaving the upper surface of the dummy gate exposed;

selectively etching the partly completed device to remove only the insulative layer thereby to expose the underlying metallic layer; and self-aligningly plating a low resistance metal layer of lower resistance than the high melting point metal layer on the exposed metallic layer to form a low resistance contact self-aligned on the high melting point gate.

2. The method of claim 1 wherein the high melting point metallic film comprises a high melting point metal silicide film.

3. The method of claim 2 wherein the high melting point metal silicide film comprises tungsten silicide.

4. The method of claim 3 wherein the high melting point metal film comprises a tungsten film having a thickness of about 100Å.

5. The method of claim 4 in which the low resistance metal layer comprises a low resistance gold layer.

6. The method of claim 1 wherein the anisotropic etching step comprises reactive ion etching.

7. The method of claim 1 wherein the selective etching step comprises wet etching.

8. The method of claim 1 wherein the step of forming a resist layer includes applying a smooth layer of resist over the partly completed device and employing reactive ion etching to etch the resist until the upper surface of the dummy gate is exposed.

9. A method of forming a semiconductor device having a metallic structure deposited on a substrate having both high temperature and low resistance properties, the method comprising the steps of:

successively depositing three layers on the substrate, the lowermost layer comprising a high melting point metallic layer, the intermediate layer comprising a thin high melting point metal layer and the uppermost layer comprising an insulator layer, the etchant properties of the respective layers being selected so that the intermediate layer has a lower etching rate than the metallic layer or the insulator layer thereby to prevent undercutting of the superimposed layers;

anisotropically etching the three superimposed layers using the intermediate high temperature metal layer to protect the metallic layer and insulator layer from undercutting thereby to form an aligned metallic structure precisely positioned on the semiconductor substrate;

depositing a resist material over the partly completed device but leaving the upper surface of the insulator layer exposed;

selectively etching the resist protected structure to remove the insulator layer thereby exposing the underlying metallic layer; and using said resist as a mask using a lift-off process to deposit a low resistance metal layer over the metallic layer in the area which had been occupied by the insulator layer, the low resistance metal layer having a resistance lower than that of the high melting point metal layer, thereby to accurately produce a self-aligned low resistance electrode over a high temperature metallic electrode.

10. The method of claim 9 wherein the high melting point metallic film comprises a high melting point metal silicide film.

11. The method of claim 10 wherein the high melting point metal silicide film comprises tungsten silicide.

12. The method of claim 11 wherein the high melting point metal film comprises a tungsten film having a thickness of about 100Å.

13. The method of claim 12 in which the low resistance metal layer comprises a low resistance gold layer.

14. The method of claim 9 wherein the anisotropic etching step comprises reactive ion etching.

15. The method of claim 9 wherein the selective etching step comprises wet etching.

16. The method of claim 9 wherein the step of depositing a resist material includes applying a smooth layer of resist over the partly completed device and employing reactive ion etching to etch the resist until the upper surface of the dummy gate is exposed.

* * * * *